(12) United States Patent
Fan et al.

(10) Patent No.: US 6,587,387 B1
(45) Date of Patent: Jul. 1, 2003

(54) DEVICE AND METHOD FOR TESTING MASK ROM FOR BITLINE TO BITLINE ISOLATION LEAKAGE

(75) Inventors: Tso-Hung Fan, Taipei Hsien (TW); Yen-Hung Yeh, Taoyuan Hsien (TW); Kwang-Yang Chan, Hsinchu (TW); Mu-Yi Liu, Taichung (TW); Tao-Cheng Lu, Kaoshiung (TW)

(73) Assignee: Macronix International Co., Ltd., Hsinchu (TW)

( * ) Notice: Subject to any disclaimer, the term of this patent is extended or adjusted under 35 U.S.C. 154(b) by 2 days.

(21) Appl. No.: 10/055,571

(22) Filed: Jan. 22, 2002

(30) Foreign Application Priority Data

Jan. 16, 2002 (TW) ........................................ 91100556 A

(51) Int. Cl.⁷ ............................................ G11C 29/00
(52) U.S. Cl. ........................ 365/201; 365/104; 365/103; 257/390
(58) Field of Search ................................. 365/103, 104, 365/94, 201, 200; 257/390

(56) References Cited

U.S. PATENT DOCUMENTS

| 5,117,389 A | * | 5/1992 | Yiu ............................ 365/104 |
| 5,383,149 A | * | 1/1995 | Hong ......................... 365/104 |
| 5,493,527 A | * | 2/1996 | Lo et al. ................. 365/185.11 |
| 5,736,771 A | * | 4/1998 | Huang et al. ............... 257/390 |
| 5,985,717 A | * | 11/1999 | Huang ........................ 438/262 |

* cited by examiner

*Primary Examiner*—Andrew Q. Tran
(74) *Attorney, Agent, or Firm*—J.C. Patents

(57) ABSTRACT

A Mask ROM testing device is described. The Mask ROM testing device comprises a substrate, a plurality of buried bit-lines in the substrate and a plurality of word-lines on the substrate perpendicular to the buried bit-lines. Each buried bit-line has two end portions with a combined length of about 3~30 μm and can have an N-type conductivity or a P-type conductivity.

12 Claims, 7 Drawing Sheets

DEVICE AND METHOD FOR TESTING MASK ROM FOR BITLINE TO BITLINE ISOLATION LEAKAGE

CROSS-REFERENCE TO RELATED APPLICATION

This application claims the priority benefit of Taiwan application serial no. 91100556, filed Jan. 16, 2002.

BACKGROUND OF THE INVENTION

1. Field of Invention

The present invention relates to a device and a method for testing a semiconductor device. More particularly, the present invention relates to a device for testing a mask read-only memory (Mask ROM) and a method for testing a Mask ROM with the testing device.

2. Description of Related Art

The Mask ROM is the simplest one in the family of the read-only memory (ROM). The Mask ROM can be divided into two types, which have different structures and different coding (programming) methods. To program one type of the Mask ROM, a coding mask is used to determine the connection relationships between a plurality of metal lines and a plurality of memory units. To program the other type of Mask ROM, a coding mask is used to selectively adjust the threshold voltages of the memory cells and thereby to set the logic states (0/1) of the memory cells. The Mask ROM product is suitable for mass production because when the data to be stored in a Mask ROM product is changed, only the coding mask needs to be modified in the whole process. It is even possible to fabricate a lot of semi-finished products in advance, thus when an order is received, the Mask ROM products can be programmed readily and then delivered to the clients to shorten the turn-around time (TAT) of the products.

After a Mask ROM process is finished, a testing procedure is usually performed to measure an array leakage of the Mask ROM, so as to determine if the Mask ROM device is qualified.

Refer to FIG. 1 and FIG. 2, wherein FIG. 1 illustrates a top view of a common Mask ROM and FIG. 2 schematically illustrates a cross-sectional view of the Mask ROM in FIG. 1 along the line I–I' and two array leakage paths therein.

As that shown in FIG. 1 and FIG. 2, the Mask ROM comprises a substrate 100, a plurality of buried bit-lines 102 in the substrate 100, and a plurality of word-lines 104 on the substrate 100 perpendicular to the buried bit-lines 102. Each word-line 104 has a gate oxide layer 103 formed thereunder. When the testing procedure is being performed, testing biases are applied to the Mask ROM to obtain a testing result. However, with the conventional testing method, only a total array leakage of the Mask ROM can be obtained and the major leakage path in the Mask ROM device can not be identified.

There are usually three possible leakage paths in a Mask ROM. Refer to FIG. 2, the first leakage path is the cell surface punch leakage represented by the arrow 10 and the second leakage path is the cell bulk punch leakage represented by the arrow 12. The third leakage path (not shown) is the bit-line to bit-line isolation leakage, which is the leakage occurring at the isolation parts between the end portions of the buried bit-lines 102 not covered by the word-lines 104.

However, with the conventional Mask ROM testing method, identifying the major leakage path out of the three possible leakage paths is impossible. Therefore, it is also impossible to exactly suit a remedy for the case to decrease the leakage.

SUMMARY OF THE INVENTION

Accordingly, this invention provides a testing device and a method for testing a Mask ROM to identify a major leakage path in the Mask ROM.

This invention also aims at eliminating the leakage source by suiting a remedy for the major leakage path identified.

The Mask ROM testing device of this invention comprises a substrate, a plurality of buried bit-lines in the substrate, and a plurality of word-lines on the substrate perpendicular to the buried bit-lines. Each word-line has a gate oxide layer formed thereunder and a spacer formed on the side-wall thereof Each buried bit-line has two end portions not covered by the word-lines with a combined length of about 3~30 $\mu$m and the buried bit-lines can have an N-type conductivity or a P-type conductivity.

In the Mask ROM testing method of this invention, the Mask ROM testing device of this invention mentioned above is used and testing biases are applied to the Mask ROM testing device to obtain the value of a total leakage.

With the Mask ROM testing device and the method for testing the Mask ROM with the Mask ROM testing device of this invention, the major leakage path of the Mask ROM can be identified, which is not accomplishable with the testing method in the prior art.

Since the major leakage path in a Mask ROM can be identified with this invention, it is possible to appropriately provide a remedy for the major leakage path identified to decrease the array leakage.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
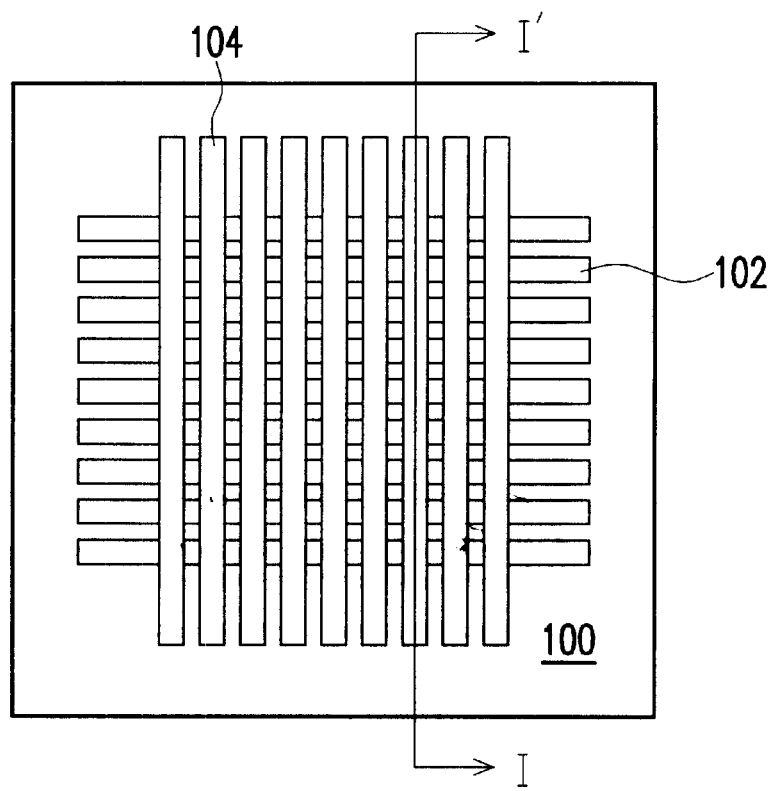
FIG. 1 illustrates a top view of a common Mask ROM.
Figure 2:
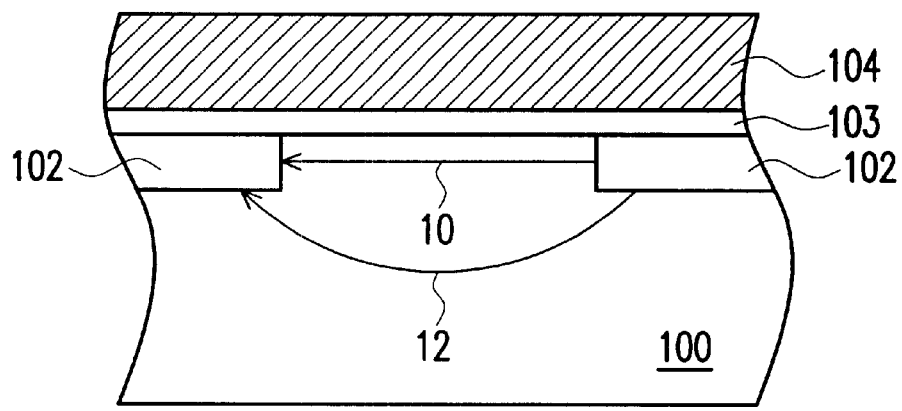
FIG. 2 schematically illustrates a cross-sectional view of the Mask ROM in FIG. 1 along the line I–I' and two of the three array leakage paths therein.
Figure 3:
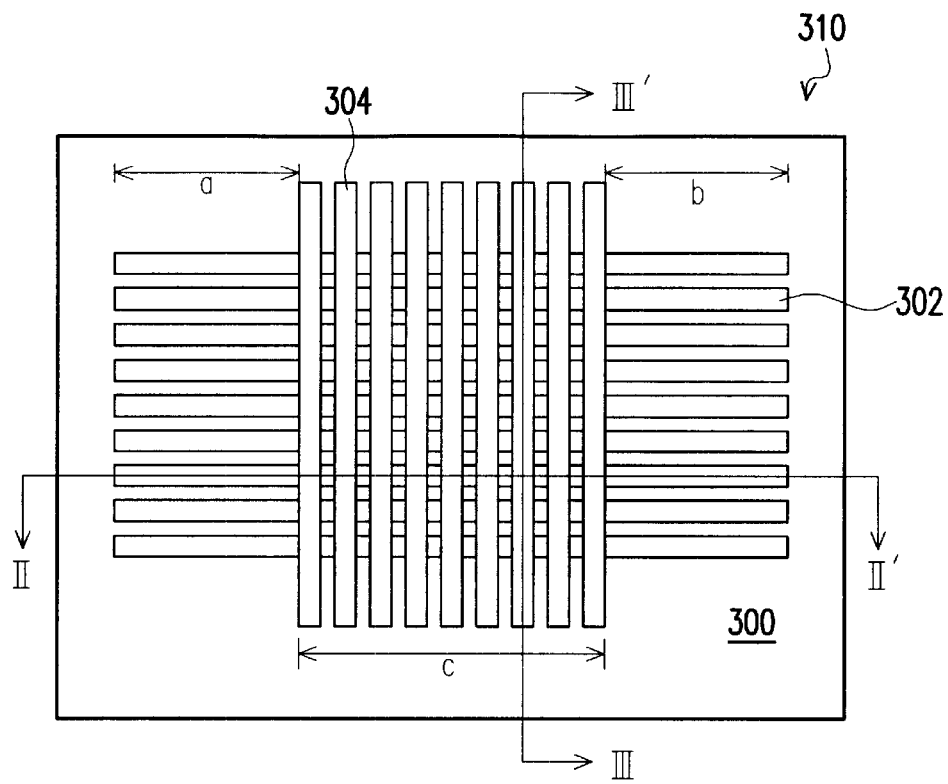
FIG. 3 schematically illustrates a top view of a Mask ROM testing device according to a preferred embodiment of this invention.
Figure 4:
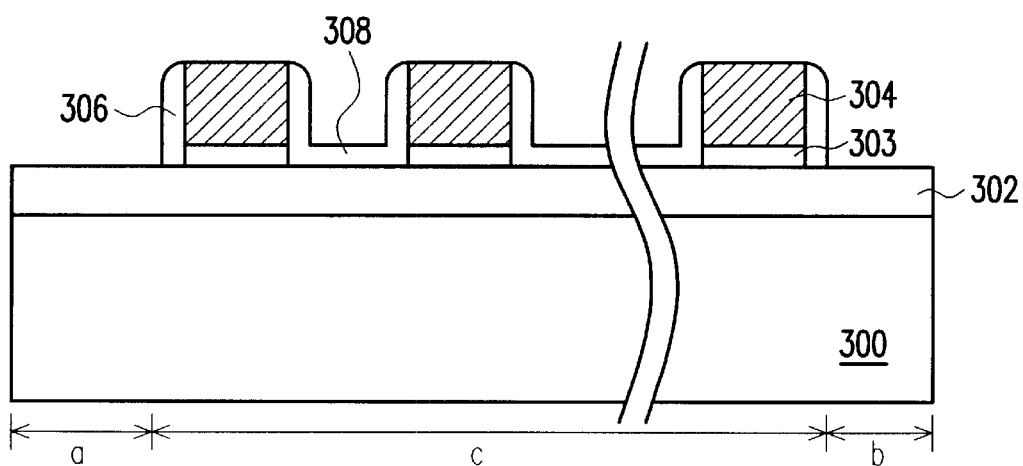
FIG. 4 schematically illustrates a cross-sectional view of the Mask ROM testing device in FIG. 3 along the line II–II'.

Refer to FIG. 3 and FIG. 4 for the structure of the Mask ROM testing device according to the preferred embodiment of this invention. FIG. 3 schematically illustrates a top view of the testing device and FIG. 4 schematically illustrates a cross-sectional view of the testing device along the line II–II' in FIG. 3.

Refer to FIG. 3 and FIG. 4, the testing device 310 comprises a substrate 300, a plurality of buried bit-lines 302 in the substrate 300 and a plurality of word-lines 304 on the substrate 300 perpendicular to the buried bit-lines 302. The distance between two adjacent buried bit-lines 302 is, for example, from about 0.1 $\mu$m to about 0.4 $\mu$m. The distance between two adjacent word-lines 304 is, for example, from about 0.1 $\mu$m to about 0.41 $\mu$m.

The word-line 304 has a gate oxide layer 303 formed thereunder and a spacer 306 formed on the side-wall thereof, wherein the spacer 306 comprises, for example, silicon oxide. The substrate 300 between the word-lines 304 may further comprise an oxide layer 308 thereon, which is a residue produced by the step of fabricating the spacer 306.

The buried bit-lines 302 can have an N-type conductivity or a P-type conductivity. The central portion of a buried bit-line 302 covered by the word-lines 304 has a length "c", and the two end portions have a length "a" and a length "b", respectively. The combined length "a+b" of the two end portions of each buried bit-line 302 ranges from about 3 $\mu$m to about 30 $\mu$m, which is one key feature of this invention.

Figure 5:
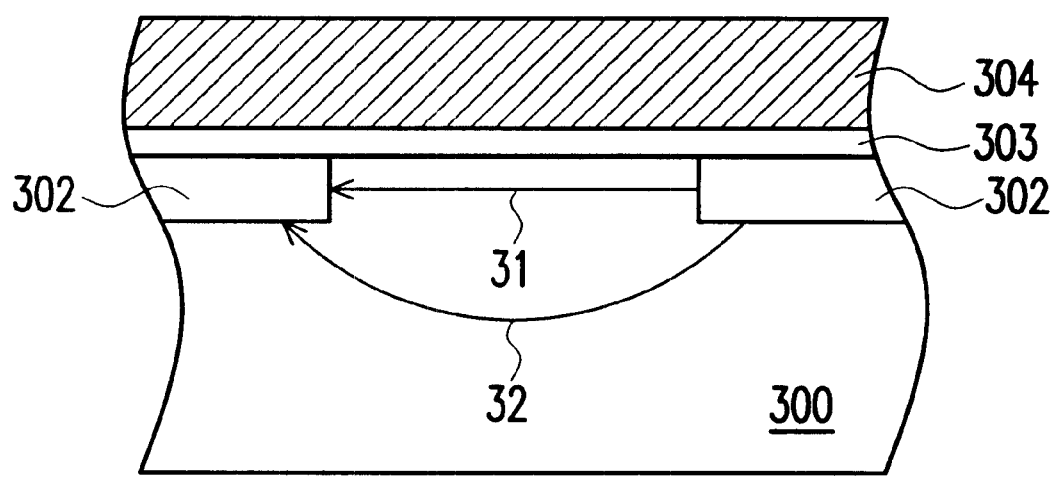
FIG. 5 schematically illustrates a cross-sectional view of the Mask ROM testing device in FIG. 3 along the line III–III' and two array leakage paths therein.

Refer to FIG. 5, FIG. 5 schematically illustrates a cross-sectional view of the Mask ROM testing device in FIG. 3 along the line III–III' and two array leakage paths therein.

When the testing device 310 is being used to identify the major leakage path in a Mask ROM, testing biases are applied to the testing device 310 to obtain the testing results. The major leakage path can be derived from the testing results.

Refer to FIG. 5 again, two of the three possible leakage paths, the cell surface punch leakage and the cell bulk punch leakage, are indicated in FIG. 5. The cell surface punch leakage is indicated by arrow 31 and the cell bulk punch leakage by arrow 32.

Figure 6:
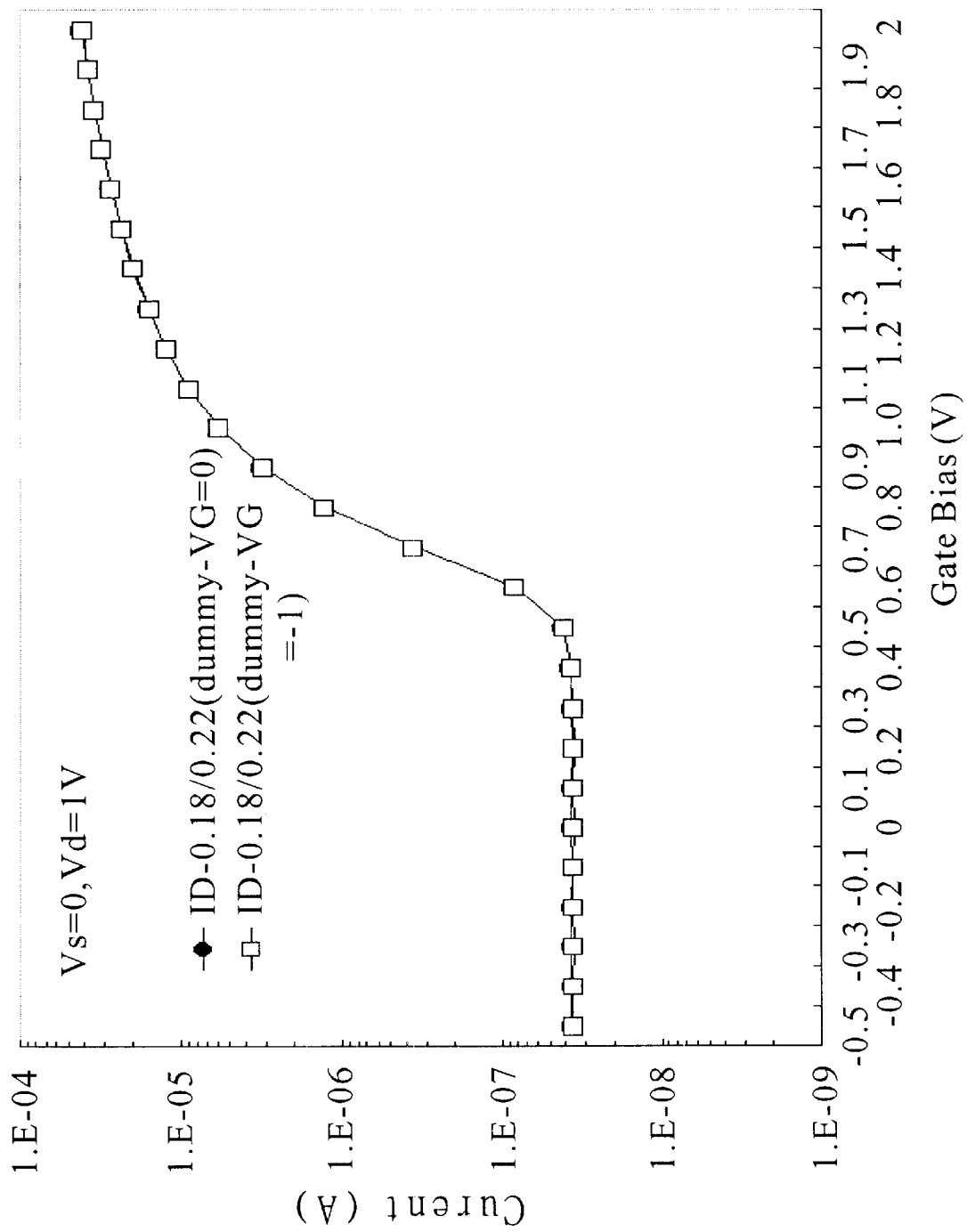
FIG. 6 plots the current in the Mask ROM testing device with regard to the gate bias according to the preferred embodiment of this invention.

Since the cell surface punch leakage 31 is directly related to the gate bias $V_g$, to estimate the contribution of the cell surface punch leakage to the total leakage current, the device current is measured with regard to the gate bias $V_g$ and the results are plotted in FIG. 6.

Refer to FIG. 6, wherein the x-axis represents the gate bias in the unit of Volt, the y-axis represents the current in the unit of Ampere, and the hollow square and the solid circle represent two different biases applied to a common dummy gate, respectively. As that shown in FIG. 6, the leakage does not vary when a different bias (0 or –1V) is applied to the common dummy gate, which means that the cell surface punch leakage 31 is not the major leakage path in the Mask ROM.

On the other hand, the cell bulk punch leakage 32 is attributed to the whole buried bit-lines 302 with a total length "a+b+c". The bit-line to bit-line isolation leakage is attributed to the two end portions of each buried bit-line 302 not covered by the word-lines 304 with a combined length "a+b".

To estimate the contributions of the cell bulk punch leakage 32 and the bit-line to bit-line isolation leakage to the total leakage current, the current density in the Mask ROM testing device is measured with regard to the gate bias under various channel lengths. The testing results are plotted in FIG. 7.

Figure 7:
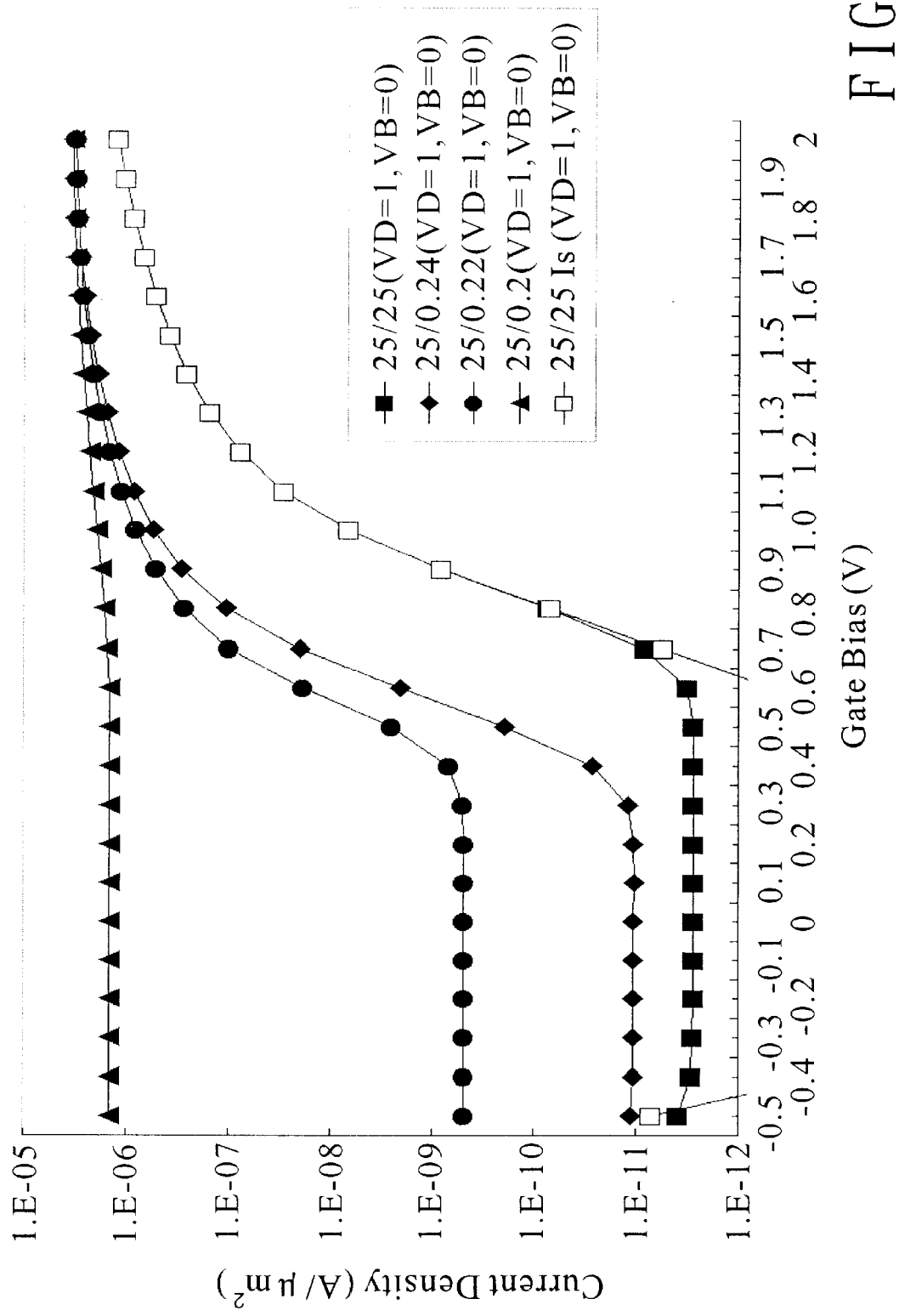
FIG. 7 plots the current density in the Mask ROM testing device with regard to the gate bias under various channel lengths according to the preferred embodiment of this invention.

Refer to FIG. 7, wherein the x-axis represents the gate bias in the unit of Volt, the y-axis represents the current density in the unit of Ampere/$\mu$m$^2$, and the various symbols represent various channel lengths, respectively. For example, the expression "25/0.24", which is used to annotate one of the curves, means that the total length of the buried bit-line is 25 $\mu$m and the channel length or the distance between two adjacent buried bit-lines is 0.24 $\mu$m. As shown in FIG. 7, the leakage current becomes larger when the channel length or the distance between two adjacent buried bit-lines is decreased, which means that the total leakage current is attributed to the cell bulk punch leakage 32 and/or the bit-line to bit-line isolation leakage.

To identify the major leakage path out of the cell bulk punch leakage 32 and the bit-line to bit-line isolation leakage, two testing devices with different structures are used. In the first testing device, the total length "a+b+c" of each buried bit-line is 50 $\mu$m and the combined length "a+b" of the two end portions of each buried bit-line is 5.54 $\mu$m. In the second testing device, the total length "a'+b'+c'" of each buried bit-line is 25 $\mu$m and the combined length "a'+b'" of the two end portions of each buried bit-line is 9.54 $\mu$m.

In the testing method according to the preferred embodiment of this invention, the same set of testing biases are applied to both the first testing device and the second testing device. The total leakage currents measured are 900 pA(10$^{-12}$A) and 1800 pA for the first testing device and for the second testing device, respectively.

It is noted that the total leakage current (1800 pA) measured on the second testing device is twice as large as that (900 pA) measured on the first testing device. Meanwhile, the combined length (a'+b'=9.54 $\mu$m) of the two end portions of each bit line in the second testing device is almost twice as large as that in the first testing device (a+b=5.54 $\mu$m). Therefore, one can conclude that the major leakage path exists in the region of the end portions of the buried bit-lines, i.e., the major leakage path is the bit-line to bit-line isolation leakage.

Figure 8:
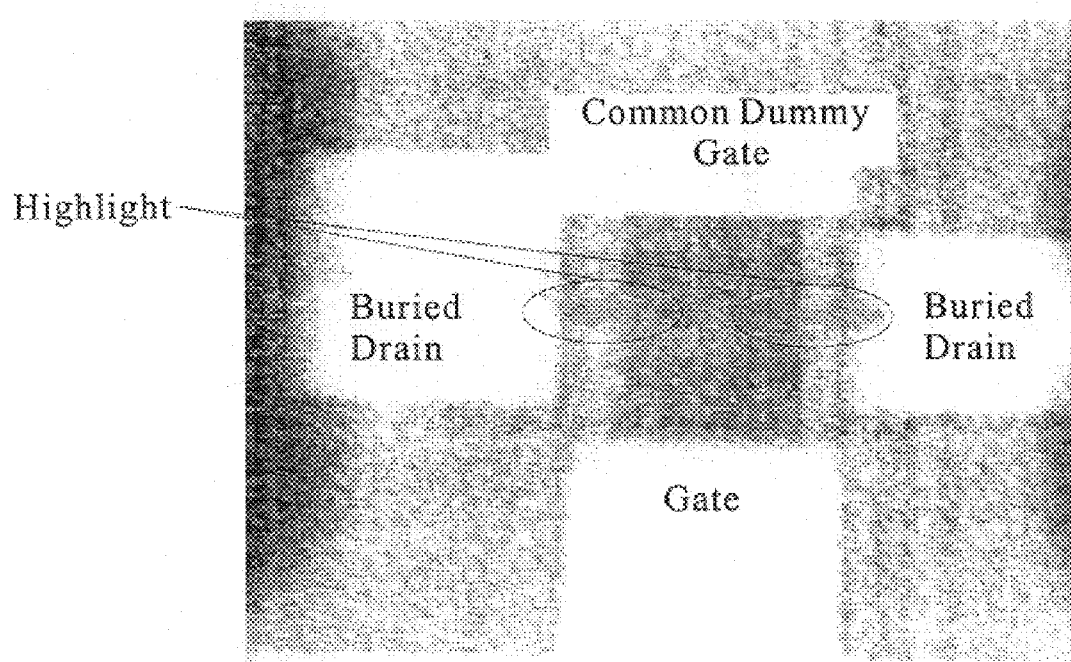
FIG. 8 shows an electronic microscopic (EM) photograph of the Mask ROM testing device that is taken when the leakage current of the testing device is measured according to the preferred embodiment of this invention.

Refer to FIG. 8, FIG. 8 shows an electronic microscopic (EM) photograph of the Mask ROM testing device, wherein the photography is taken when the leakage current of the testing device is measured according to the preferred embodiment of this invention.

When a bias of 3V is applied to the buried bit-line, a leakage current of 150 $\mu$A occurs within a period of 240 seconds. As that shown in FIG. 8, two highlights, which indicate the occurrence of leakage, appear at the two end portions of the buried bit-lines. Therefore, one can further confirm that the major leakage path exists in the region of the end portions of the buried bit-lines, i.e., the major leakage path is the bit-line to bit-line isolation leakage.

Figure 9:
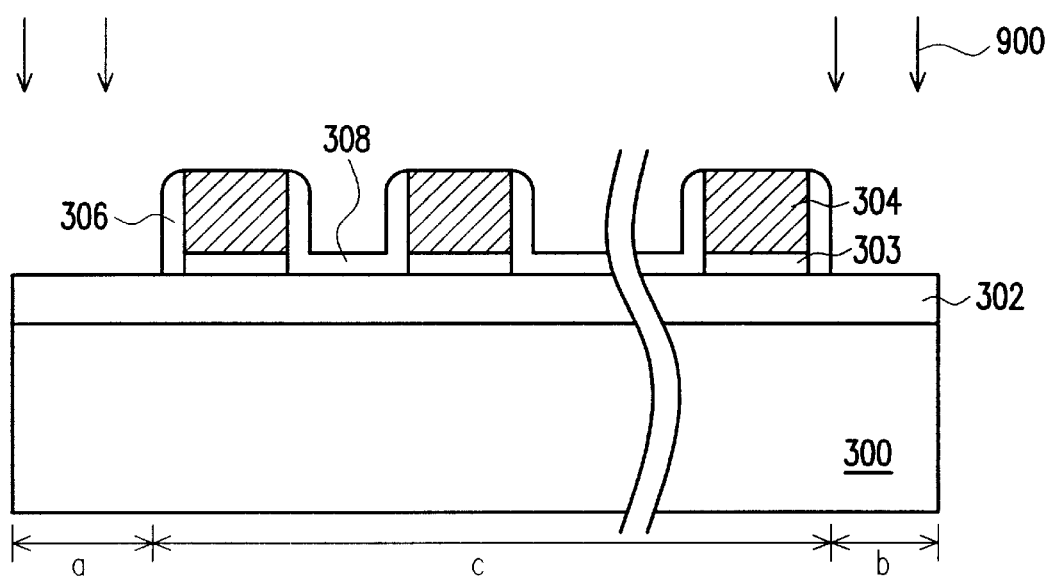
FIG. 9 schematically illustrates a method for eliminating the leakage source in a Mask ROM according to the preferred embodiment of this invention.

Refer to FIG. 9, FIG. 9 schematically illustrates a method for eliminating the leakage source in a Mask ROM according to the preferred embodiment of this invention.

Since the major leakage source in a Mask ROM is identified to be the bit-line to bit-line isolation leakage, as that shown in FIG. 9, one can eliminate the leakage source by implanting ions 900 with a different conductivity type into the region of the end portions of the buried bit-lines 302. The reason is that the leakage mostly comes from the over-etching step for fabricating the spacer 306 or from the blank N-type (or P-type) implantation process for fabricating a PMOS (or NMOS). Implanting P-type (or N-type) ions into the region of the end portions of the buried bit-lines 302 can significantly decrease the leakage current.

With the Mask ROM testing device and the testing method of this invention, the major leakage path of the Mask ROM can be identified, which is not accomplishable with the testing device and the testing method in the prior art. Furthermore, since the leakage path can be identified with this invention, it is possible to appropriately select a remedy for the leakage path to eliminate the leakage.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A Mask ROM testing device for identifying an array leakage path in a Mask ROM, comprising:

a substrate;

a plurality of buried bit-lines in the substrate; and a plurality of word-lines on the substrate perpendicular to the buried bit-lines, wherein each buried bit-line has two end portions not covered by the word-lines with a combined length from about 3 $\mu$m to about 30 $\mu$m.

2. The Mask ROM testing device of claim 1, wherein a distance between two adjacent word-lines ranges from 0.1 $\mu$m to 0.4 $\mu$m.

3. The Mask ROM testing device of claim 1, wherein a distance between two adjacent buried bit-lines ranges from 0.1 $\mu$m to 0.4 $\mu$m.

4. The Mask ROM testing device of claim 1, wherein each word-line is located on a gate oxide layer.

5. The Mask ROM testing device of claim 1, wherein each word-line has a spacer formed on a side-wall thereof.

6. The Mask ROM testing device of claim 1, wherein the buried bit-lines have an N-type conductivity or a P-type conductivity.

7. A method for testing a Mask ROM for identifying an array leakage path in the Mask ROM, comprising:

providing a testing device comprising a plurality of buried bit-lines in a substrate and a plurality of word-lines on the substrate perpendicular to the buried bit-lines, wherein each buried bit-line has two end portions not covered by the word-lines with a combined length from about 3 $\mu$m to about 30 $\mu$m; and applying test biases to the testing device and measuring a total leakage current in the testing device.

8. The method of claim 7, wherein a distance between two adjacent word-lines ranges from 0.1 $\mu$m to 0.4 $\mu$m.

9. The method of claim 7, wherein a distance between two adjacent buried bit-lines ranges from 0.1 $\mu$m to 0.4 $\mu$m.

10. The method of claim 7, wherein each word-line is located on a gate oxide layer.

11. The method of claim 7, wherein each word-line has a spacer formed on a side-wall thereof.

12. The method of claim 7, wherein the buried bit-lines have an N-type conductivity or a P-type conductivity.

\* \* \* \* \*